United States Patent [19]

Shah et al.

[11] Patent Number: 4,758,497

[45] Date of Patent: Jul. 19, 1988

[54] PHOTOSENSITIVE NAPHTHOQUINONE DIAZIDE SULFONYL ESTER COMPOUNDS FOR THE FABRICATION OF LITHOGRAPHIC PLATES AND PHOTOSENSITIVE SHEET CONSTRUCTION WITH THE COMPOUNDS

[75] Inventors: Ajay Shah, Elizabeth; William Rowe, Califon, both of N.J.

[73] Assignee: Polychrome Corporation, Yonkers, N.Y.

[21] Appl. No.: 39,414

[22] Filed: Apr. 17, 1987

Related U.S. Application Data

[63] Continuation of Ser. No. 768,261, Aug. 22, 1985, abandoned.

[51] Int. Cl.$^4$ ...................... G03C 1/54; C07C 113/00
[52] U.S. Cl. .................... 430/193; 430/191; 430/192; 430/270; 430/292; 430/302; 430/920; 534/557
[58] Field of Search ............... 430/920, 190, 191, 192, 430/193; 534/556, 557

[56] References Cited

U.S. PATENT DOCUMENTS

| | | | |
|---|---|---|---|
| 3,644,118 | 2/1972 | Agnihotri | 430/190 |
| 3,652,285 | 3/1972 | Delzenne et al. | 430/191 |
| 3,711,285 | 1/1973 | Deutsch et al. | 430/193 |
| 3,869,292 | 3/1975 | Peters | 430/192 |
| 3,954,475 | 5/1976 | Bonham et al. | 430/920 |
| 4,139,384 | 2/1979 | Iwasaki et al. | 430/190 |
| 4,160,671 | 7/1979 | Stahlhofen | 430/192 |
| 4,350,753 | 9/1982 | Shelnut et al. | 430/191 |
| 4,467,025 | 8/1984 | Goto et al. | 430/193 |
| 4,493,884 | 6/1985 | Nagano et al. | 430/190 |

*Primary Examiner*—Bowers, Jr. Charles L.
*Attorney, Agent, or Firm*—Lawrence Rosen

[57] ABSTRACT

The invention features a new series of triazine compounds which are characterized by their ability to generate free radicals upon irradiation in a desired optical region, such that they are useful in the fabrication of lithographic plates having improved exposure speed, development, print-out, and contrast characteristics.

6 Claims, No Drawings

PHOTOSENSITIVE NAPHTHOQUINONE DIAZIDE SULFONYL ESTER COMPOUNDS FOR THE FABRICATION OF LITHOGRAPHIC PLATES AND PHOTOSENSITIVE SHEET CONSTRUCTION WITH THE COMPOUNDS

This application is a continuation of Ser. No. 768,261, filed Aug. 22, 1985, now abandoned.

FIELD OF THE INVENTION

The present invention relates to improved photosensitive compounds utilized in lithographic plate fabrication, and more particularly to a new series of triazine compounds and a method of making the same.

BACKGROUND OF THE INVENTION

Chromophore substituted vinyl halomethyl-s-triazines are photosensitive compounds capable of free radical generation and useful in the fabrication of lithographic plates, according to the teachings of U.S. Pat. No. 3,954,475 issued May 4, 1976 to Bonham and Petrellis.

For the purpose of avoiding unnecessary duplication, the disclosure in the aforementioned patent is incorporated herein by reference, especially column 1, line 10, to column 2, line 65; and column 7, line 60 to column 10, line 17.

The compounds taught by the Bonham et al. patent have been found to have a limited spectral sensitivity, which inhibits their ability to utilize radiant energy efficiently.

The present invention seeks to provide a new series of triazine compounds that generate free radicals with spectral sensitivity in the desired region. Such compounds can be used to fabricate lithographic plates having improved development characteristics, such as shorter exposure times, higher print-out values, longer shelf life and greater stability.

BRIEF SUMMARY OF THE INVENTION

The invention pertains to a new series of triazine compounds for use in the fabrication of lithographic plates, having the general formula:

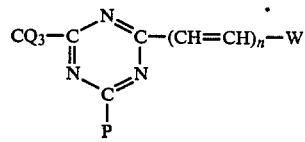

wherein Q is bromine or chlorine; P is $-CQ_3$, $-NH_2$, $-NHR$, $-NHR_2$, or $-OR_1$; where $R_1$ and $R_2$ are the same or different and are a phenyl or alkyl group of no more than 6 carbons; n is an integer from 1 to 3; and W is a moiety having the formula:

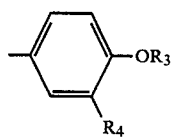

wherein $R_3$ is an acryloyl, methacryloyl, crotonyl or cinnamoyl radical; and $R_4$ is hydrogen, a lower alkyl group having from 1 to 9 carbon atoms, or lower alkoxy group having from 1 to 9 carbon atoms.

Improved lithographic plates are fabricated from an aluminum substrate comprising a sheet coated with a light sensitive compound whose coating contains a compound of the above formula. The above compound is prepared by adding a 1,2-naphthoquinone-(2)-diazido-4 or 5-sulfonyl halide to a 2(4-hydroxy-3-methoxy styryl)-4,6-bis(trichloromethyl)-s-triazine (referred to hereinafter as "Triazine D") in a solvent. To this mixture is added a triethylamine while agitating the mixture at approximately 35° to 45° C. for about 10 to 12 hours in order that the 1,2-naphthoquinone(2)diazide-4 or -5-sulfonyl halide reacts completely. The desired aforementioned compound is then precipitated from the solvent.

BRIEF DESCRIPTION OF THE DRAWINGS

FIG. 1 is a graph depicting the coefficient of optical density of a compound of the invention coated on a lithographic plate as compared with a standard triazine compound coated plate; and FIG. 2 is a graph illustrating the results of an exposure test for the compound of the invention coated on a lithographic plate compared with a standard triazine compound coated plate.

DETAILED DESCRIPTION OF THE INVENTION

A compound of the present invention hereinafter designated as Triazine V-DC, has the formula:

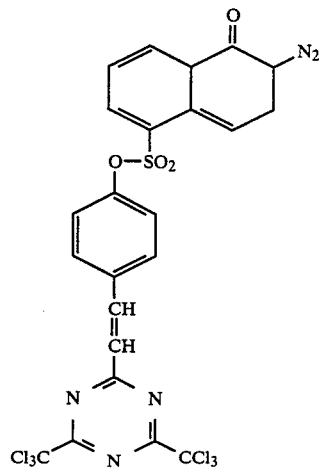

The triazine V-DC is synthesized from the compound 2(4 hydroxy 3 methoxy styryl)-4,6-bis(trichloromethyl)-s-triazine (hereinafter referred to as "Triazine V") which in turn is prepared from condensation of 2-methyl-4,6-bis(trichloro-methyl)-s-triazine and vanillin. The 2-methyl-4,6-bis(trichloro-methyl)-s-triazine is obtained from the cotrimerization of trichloroacetonitrile and acetonitrile of The triazines of this invention have the general formula:

$$CQ_3-C \overset{N}{\underset{N}{=}} C-(CH=CH)_n-W$$
$$\phantom{CQ_3-C}\underset{\underset{P}{|}}{\overset{\|}{C}}$$

wherein Q is bromine or chlorine; P is $-CQ_3$, $-NH_2$, $-NHR_1$, $-NHR_2$ or $-OR_1$; where $R_1$ and $R_2$ are the same or different and are a phenyl or alkyl group of no more than 6 carbons; N is an integer from 1 to 3; and W is a moiety having the formula:

[benzene ring with $-OR_3$ and $R_4$ substituents]

wherein $R_3$ and $R_4$ are as defined above.

Triazine V-DC is synthesized according to the following example:

EXAMPLE 1

In a 500 ml round flask, equipped with stirrer, reflux condenser and heating mantle were placed 7.04 g of 2(4-hydroxy-3-methoxy styryl)-4,6-bis(trichloromethyl)-s-triazine and 250 g of 2 methoxy methyl ether as the solvent. The contents were warmed to 40° C. and the temperature maintained during the reaction. Then 4.04 g of 1,2-naphthoquinone(2)-diazido-5-sulfonyl chloride was added and the contents stirred for 15 mins. Then within 20-30 minutes were added a solution of 1.6 g triethylamine dissolved in 10 g of 2 methoxy methyl ether. The stirring continued for at least 10-12 hours at 40° C. until the disappearance of the 1,2-naphthoquinone-(2)-diazido 5-sulfonylchloride (thin layer chromatography was used for this purpose).

Triazine V-DC was precipitated from the above mixture by adding a 25485.4

Triazine V-DC had a maximum absorption at 358 nm with an extinction coefficient of The Triazine V-DC was coated on an aluminum substrate having an interlayer of Tamol. The weight of the coating was 2.2 g/m². The deposited coating was dried for 15 minutes at 90° C.

Triazine V-acrylate may be prepared according to the following example:

EXAMPLE 2

In a 500 ml round flask, equipped with stirring, reflux condenser and heating mantle were placed 928 g Triazine V and 150 g 2 methoxy methyl ether as the solvent. The reaction was carried out under inert atmosphere. With stirring were added 1.8 g acryoyl chloride. Then slowly within 25 minutes were added a solution of 2.04 g triethylamine dissolved in 10 g of 2 methoxy methyl ether. The stirring continued for at least 10-12 hours at 40° C. until the disappearance of acryoyl chloride. (The reaction may be done at elevated temperature in less time.)

The Triazine V-acrylate was precipitated from the above mixture by adding to a salt water solution. (1½% by weight of salt.)

The product had a maximum absorption at 377 mm with an extinction coefficient of 2-2-792 and a melting point of 134°-135° C.

The following components were in

TABLE I

| Component No. | Chemical Name |
| --- | --- |
| 1 | 2(p-methoxy styryl)-416-bis(trichloromethyl)-s-triazine |
| 2 | 2(4-hydroxy-3-methoxy-styryl)4,6-bis(trichloromethyl)-s-triazine |
| 3 | Triazine V-DC |
| 4 | Triazine V-acrylate |

Compounds 1 and 2 are covered under U.S. Pat. No. 3,954,475 and 3 and 4 are compounds of the present invention.

Coating formulations set forth below illustrate the present invention. Each of the above components were added separately into this formulation and lithographic plates were prepared. The evaluation of plate in terms of optical density or print out and contrast were then done and results are then put in Table II below:

EXAMPLE 3

An electrolytically grained and anodically oxidized aluminum plate having an oxide layer weighing about 3 g/m² was treated according to U.S. Pat. No. 4,446,221. A filtered solution of following preparation,

TABLE II

| | Components-parts/wt. | | | |
| --- | --- | --- | --- | --- |
| Components of formulation* | A | B | C | D |
| naphthoquinone diazide sulfonic acid ester of pyrogallol-acetone resin U.S. patent | 3.3 | 3.3 | 3.3 | 3.3 |
| phenyl/formaldehyde novalac having a melting range of 110-120° C. according to DIN 53181 (PN-430 Hoechst AOC) | 6.12 | 6.12 | 6.12 | 6.12 |
| Estane 5715 (Goodrich) | 0.20 | 0.20 | 0.20 | 0.20 |
| Bromophenol blue | 0.18 | 0.18 | 0.18 | 0.18 |
| Tetraethylamine | 0.16 | 0.16 | 0.16 | 0.16 |
| Component (1) | 0.20 | — | — | — |
| Component (2) | — | 0.20 | — | — |
| Component (3) | — | — | 0.20 | — |
| Component (4) | — | — | — | 0.20 |

*89.84 parts of a solvent mixture comprising: 2 parts by volume methylethyl ketone 3 parts by volume methyl isobutyl ketone 3 parts by volume primary amyl ketone 2 parts by volume ethyl cellosolve The resulting formulations were applied to the pretreated support and dried. The resulting light sensitive material was exposed imagewise under a halftone positive original and was then developed with the following solution:
0.87 parts sodium hydroxide
7.06 parts sodium silicate solution 13' 58.5
92.07 parts water
The results are set forth below:

TABLE III*

| | $D_1$ | $D_2$ | $D_3$ | $\Delta V$ | $\Delta C$ | Developability |
| --- | --- | --- | --- | --- | --- | --- |
| A | 0.78 | 0.45 | 0.23 | 0.33 | 0.55 | fair |
| B | 0.84 | 0.46 | 0.23 | 0.38 | 0.61 | good |
| C | 0.83 | 0.47 | 0.23 | 0.36 | 0.60 | excellent |
| D | 0.84 | 0.46 | 0.23 | 0.38 | 0.62 | excellent |

$D_1$ = optical density of unexposed photosensitive material
$D_2$ = optical density of exposed photosensitive material
$D_3$ = optical density of non image area
$\Delta V$ = visibility or printout $D_1-D_2$
$\Delta C$ = contrast $D_1-D_3$
*Measurement instrument: Macbeth densitometer (no filter)

The above data demonstrate that when using the triazines of the present invention visibility and contrast are equal or better than obtained using known substances. Furthermore, shelf life and developability are excellent when compared to Components 1 and 2.

Although the present invention has been demonstrated in the foregoing embodiments, it will be understood that the invention is subject to modifications and variations without departing from its broader aspects.

What is claimed is:

1. A photosensitive sheet construction comprising a substrate having a light-sensitive coating thereon, said coating comprising a compound having the formula:

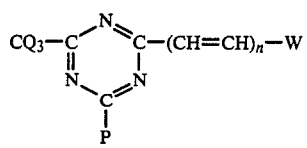

wherein Q is bromine or chlorine; P is $-CQ_3$, $-NH_2$, $-NHR_1$, $-NHR_2$ or $-OR_1$; where $R_1$ and $R_2$ are the same or different and are a phenyl or alkyl group of no more than 6 carbons; n is 1; and W is a moiety having the formula:

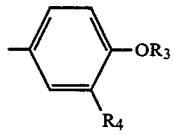

wherein $R_3$ is 1,2-naphthoquinone-(2)-5-sulfonyl radical; and $R_4$ is hydrogen, a lower alkyl group having from 1 to 9 carbon atoms, or lower alkoxy group having from 1 to 9 carbon atoms.

2. The photosensitive sheet of claim 1 wherein the compound comprises approximately 1 to 4% by weight of said coating.

3. The compound of claim 1 wherein Q is Cl and P is $CCl_3$.

4. A compound having the formula:

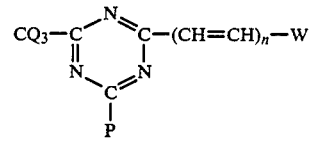

wherein Q is bromine or chlorine; P is $-CQ_3$, $-NH_2$, $-NHR_1$, $-NHR_2$, or $-OR_1$; where $R_1$ and $R_2$ are the same or different and are a phenyl or alkyl group of no more than 6 carbons, n is 1; and W is a moiety having the formula:

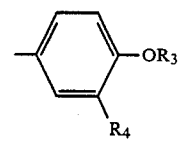

wherein $R_3$ is 1,2-naphthoquinone-(2)-5-sulfonyl radical; and $R_4$ is hydrogen, a lower alkyl group having from 1 to 9 carbon atoms, or lower alkoxy group having from 1 to 9 carbon atoms.

5. The compound of claim 4 wherein Q is Cl and P is $CCl_3$.

6. A triazine derivative having the following structural formula:

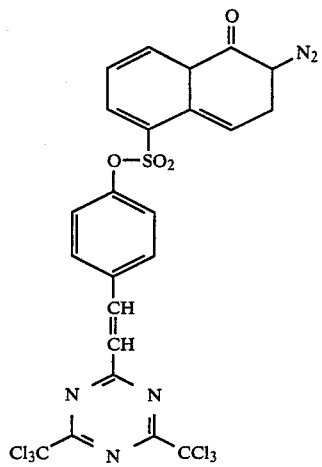

* * * * *